United States Patent [19]

Nilssen

[11] Patent Number: 4,513,364
[45] Date of Patent: Apr. 23, 1985

[54] THERMALLY CONTROLLABLE VARIABLE FREQUENCY INVERTER

[76] Inventor: Ole K. Nilssen, Caesar Dr., Rte. 5, Barrington, Ill. 60010

[21] Appl. No.: 544,567

[22] Filed: Oct. 24, 1983

Related U.S. Application Data

[63] Continuation-in-part of Ser. No. 178,107, Aug. 14, 1980, abandoned.

[51] Int. Cl.³ .......................................... H02M 7/537
[52] U.S. Cl. ................... 363/132; 315/219; 315/DIG. 4; 323/329; 331/70; 331/113 A
[58] Field of Search .................. 363/17, 22, 100, 132, 363/133, 23; 331/69, 70, 181; 315/DIG. 4, 244; 323/329, 249, 250, 331

[56] References Cited

U.S. PATENT DOCUMENTS

| | | | |
|---|---|---|---|
| 3,133,256 | 5/1964 | Denelsbeck et al. | 331/113 A |
| 3,176,218 | 3/1965 | Brooks | 323/352 |
| 3,263,122 | 7/1966 | Genuit | 315/209 |
| 3,275,948 | 9/1966 | Rosenbusch | 331/113 A |
| 3,320,510 | 5/1967 | Locklair | 331/113 A |
| 3,327,244 | 6/1967 | Fay et al. | 331/113 A |
| 4,017,780 | 4/1977 | Cowett | 331/70 |
| 4,053,813 | 10/1977 | Kornrumpf | 315/209 |
| 4,346,340 | 8/1982 | Hackett-Jones | 323/250 |

Primary Examiner—William H. Beha, Jr.

[57] ABSTRACT

A self-oscillating inverter circuit wherein the inversion frequency can be controlled by way of providing a controllable flow of electrical power to a resistor heating means that is thermally coupled to a saturable magnetic ferrite transformer used in the inverter's positive feedback loop. By way of its saturation characteristics, the saturable transformer determines the inversion frequency. These saturation characteristics are substantially influenced by temperature; which therefore provides the basis for controlling the frequency by controlling the flow of electrical power to the resistor heating means.

6 Claims, 2 Drawing Figures

THERMALLY CONTROLLABLE VARIABLE FREQUENCY INVERTER

This application is a continuation-in-part of application Ser. No. 178,107, filed Aug. 14, 1980, now abandoned in favor of application Ser. No. 555,426, filed Nov. 23, 1983.

BACKGROUND OF THE INVENTION

1. Field of the Invention

The present invention relates to inverter circuits, particularly of the kind wherein the inverter output is controllable.

2. Description of Prior Art

Inverter circuits are used in a wide variety of applications, one of which relates to the ballasting of fluorescent lamps.

In many cases generally, but particularly in fluorescent lamp ballasting, it is often desirable to be able controllably and electrically to adjust the output of an inverter.

Various arrangements to accomplish such control of inverter output have been described in published literature, such as in U.S. Pat. No. 4,207,498 to Spira et al. and in U.S. Pat. No. 4,346,332 to Walden.

However, the presently known arrangements for accomplishing such output control are more complex and costly than desirable for most commercial applications.

SUMMARY OF THE INVENTION

Objects of the Invention

An initial object of the present invention is that of providing for an improved method of controlling the output of an inverter.

A second object is that of providing a cost-effective way of controllably regulating the output of an inverter by way of an electrical control input.

These as well as other objects, features and advantages of the present invention will become apparent from the following description and claims.

Brief Description

In its preferred embodiment, the present invention constitutes a two-transistor push-pull self-oscillating inverter circuit wherein saturable transformer means are used in the positive feedback path to determine the inversion frequency.

The inversion frequency is determined by the saturation characteristics of the saturable transformer (or inductor) means; which saturation characteristics are chosen such as to be substantially affected by temperature.

A resistor heating means is thermally coupled to the saturable inductor means; and, by adjusting the amount of electric power applied to this heating means, the temperature of the saturable inductor means can be adjusted, which implies that the inversion frequency can be controlled by controlling the amount of electric power applied to this heating means.

Being used in the positive feedback path, rather than in the output circuit, the physical size of the saturable transformer means is very small compared with the amount of power that the inverter is capable of delivering. Thus, the amount of power required to effect useful temperature changes is quite small. An input power of about 1.0 Watt to the heating means is enough to cause a 35% increase in the inversion frequency.

By way of a frequency dependent element in circuit between the inverter output and the load, control of power output is achieved by way of this control of inversion frequency.

DESCRIPTION OF THE PREFERRED EMBODIMENT

Description of the Drawings

Figure 1:
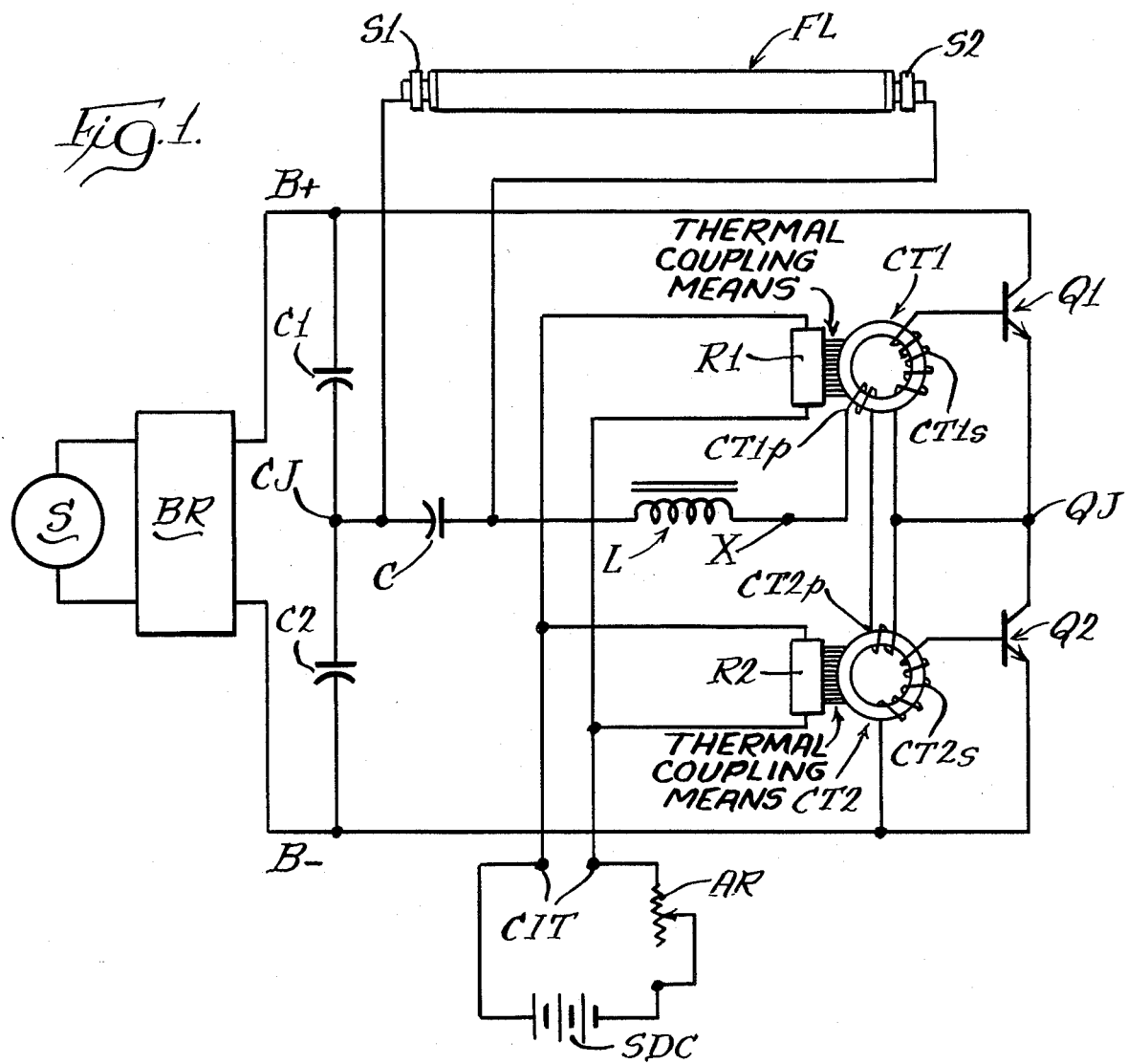
FIG. 1 diagrammatically illustrates the preferred embodiment of an inverter circuit with saturable transformer means in its positive feedback path and with electrical means for affecting control of the inversion frequency.

In FIG. 1, a source S of 120 Volt/60 Hz voltage is applied to a full-wave bridge rectifier BR, the unidirectional voltage output of which is applied directly between a B+ bus and a B− bus, with the positive voltage being connected to the B+ bus.

Between the B+ bus and the B− bus are connected a series-combination of two transistors Q1 and Q2 as well as a series-combination of two energy-storing capacitors C1 and C2.

The secondary winding CT1s of positive feedback current transformer CT1 is connected directly between the base and the emitter of transistor Q1; and the secondary winding CT2s of positive feedback current transformer CT2 is connected directly between the base and the emitter of transistor Q2.

The collector of transistor Q1 is connected directly with the B+ bus; the emitter of transistor Q2 is connected directly with the B− bus; and the emitter of transistor Q1 is connected directly with the collector of transistor Q2, thereby forming junction QJ.

One terminal of capacitor C1 is connected directly with the B+ bus, while the other terminal of capacitor C1 is connected with a junction CJ. One terminal of capacitor C2 is connected directly with the B− bus, while the other terminal of capacitor C2 is connected directly with junction CJ.

An inductor L and a capacitor C are connected in series with one another and with the primary windings CT1p and CT2p of transformers CT2.

The series-connected primary windings CT1p and CT2p are connected directly between junction QJ and a point X. Inductor L is connected with one of its terminals to point X and with the other of its terminals to one of the terminals of capacitor C. The other terminal of capacitor C is connected directly with junction CJ.

A fluorescent lamp FL is connected, by way of lamp sockets S1 and S2, in parallel circuit across capacitor C.

Respectively, the two current transformers CT1 and CT2 are thermally connected with heating resistors R1 and R2; which two resistors are series-connected across control input terminals CIT. Also in series across these terminals are connected an adjustable resistor AR and a source of DC voltage SDC.

Values and designations of the various parts of the circuit of FIG. 1 are listed as follows:

Output of Source S:—120 Volt/60 Hz;
Bridge rectifier BR:—a bridge of four 1N4004's;

Capacitors C1 & C2:—100 uF/100 Volt Electrolytics;
Transistors Q1 & Q2:—Motorola MJE13002's;
Capacitor C:—15 nF/1000 Volt (High-Q);
Inductor L:—130 turns of three twisted strands of #30 wire on a 3019P-L00-3C8 Ferroxcube Ferrite Pot Core with a 120 mil air gap;
Transformers CT1 & CT2:—Wound on Ferroxcube Toroids 213T050 of 3E2A Ferrite Material with three turns of #26 wire for the primary windings and ten turns of #30 wire for the secondary windings;
Fluorescent Lamp FL:—Sylvania Octron F032/31K;
Resistors R1 & R2:—0.2kOhm/1 Watt Wirewound's.

The frequency of inverter oscillation associated with the component values identified above—with no power supplied to resistors R1 and R2—is approximately 33 kHz.

Figure 2:
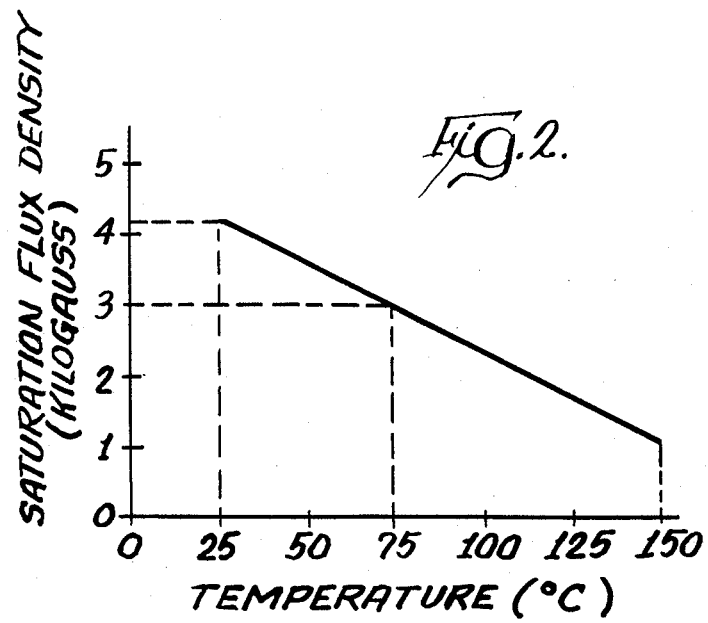
FIG. 2 illustrates the effect of temperature on the saturation characteristics of the magnetic material used in the saturable transformer means.

FIG. 2 shows the relationship between temperature and saturation flux density of the Ferroxcube 3E2A ferrite material used in feedback current transformers CT1 and CT2.

Description of Operation

The operation of the circuit of FIG. 1 may be explained as follows.

In FIG. 1, the source S represents an ordinary electric utility power line, the voltage from which is applied directly to the bridge rectifier identified as BR. This bridge rectifier is of conventional construction and provides for the rectified line voltage to be applied to the inverter circuit by way of the B+ bus and the B− bus.

The two energy-storing capacitors C1 and C2 are connected directly across the output of the bridge rectifier BR and serve to filter the rectified line voltage, thereby providing for the voltage between the B+ bus and the B− bus to be substantially constant. Junction CJ between the two capacitors serves to provide a power supply center tap.

The inverter circuit of FIG. 1, which represents a so-called half-bridge inverter, operates in a manner that is analogous with circuits previously described in published literature, as for instance in U.S. Pat. No. 4,184,128 entitled High Efficiency Push-Pull Inverters.

The inverter circuit is shown without any means for initiating inverter oscillation. However, once B+ power is applied, oscillation can be initiated simply by momentarily connecting a 50 nF capacitor between the B+ bus and the base of transistor Q2. Or, as is used in many other inverter circuits, an automatic triggering arrangement consisting of a resistor, capacitor, and a Diac may be used.

At a temperature of 25 Degrees Centigrade, the output of the half-bridge inverter is a substantially squarewave 33 kHz AC voltage. This squarewave voltage is provided between point X and junction CJ; across which output is connected a resonant or near-resonant L-C series circuit—with the fluorescent lamp being connected in parallel with the tank-capacitor thereof.

The resonant or near-resonant action of the L-C series circuit provides for appropriate lamp starting and operating voltages, as well as for proper lamp current limiting; which is to say that it provides for appropriate lamp ballasting.

(Resonant or near-resonant ballasting has been described in previous publications, as for instance in U.S. Pat. No. 3,710,177 entitled Fluorescent Lamp Circuit Driven Initially at Lower Voltage and Higher Frequency.)

The essential feature of the present invention, which involves that of controlling the inversion frequency by way of controlling the temperature of the magnetic cores of the feedback current transformers, can best be understood by recognizing that—in the inverter circuit of FIG. 1—the ON-time of a given transistor is a direct function of the saturation flux density of the magnetic core in the saturable feedback transformer associated with that transistor. Thus, other things being equal and in view of the relationship illustrated by FIG. 2, the inversion frequency is a substantially proportional function of the temperature of the ferrite cores used in CT1 and CT2.

However, it should also be understood that the transistor ON-time is a substantially inverse proportional function of the magnitude of the voltage presented to the secondary windings of the saturable feedback current transformers by the base-emitter junctions of the two transistors. That is, other things being equal, the inversion frequency is substantially a proportional function of the magnitude of this junction voltage; which is to say, since the magnitude of this junction voltage decreases in approximate proportion to temperature, that the inversion frequency decreases with increasing temperature on the transistors.

When combining the two effects outlined above, and by matching the effects on the inversion frequency due to the temperature effects of ferrite material with those of the counter-working temperature effects of the transistors' base-emitter junction, it is possible substantially to cancel any change in inversion frequency that otherwise might result from temperature changes occuring in a normally operating inverter circuit.

However, aside from any normally occuring changes in the inversion frequency, it is—according to the present invention—possible in a cost-effective and practical manner to cause substantial additional changes in the inversion frequency. Such changes can controllably be accomplished by way of providing a controllable flow of additional heat to the ferrite cores of the saturable feedback transformers; which is exactly what is accomplished by the two resistors identified as R1 and R2; which two resistors are coupled to the ferrite cores in close thermal relationship.

A given flow of power to the two resistors causes a corresponding proportional temperature rise of the ferrite material. Thus, the inversion frequency will increase from its base value in approximate proportion to the power input to the resistors. In the particular case of the circuit of FIG. 1, where the amount of power flowing to the two resistors is controlled by the adjustable resistor AR, a net power flow to the two resistors of about 1.0 Watt results in a temperature rise of 40 Degrees Centigrade in the ferrite material, and provides for an increase in inversion frequency from 33 kHz to about 45 kHz.

In the circuit of FIG. 1, the purpose of frequency control is that of effecting control of the power output, which is accomplished by way placing a frequency dependent or reactive element in circuit with the load. That way, as the frequency is varied, the flow of power to the load is varied in some corresponding manner.

For extra effective control, this reactive element can be a tuned circuit—as indeed is used in the arrangement of FIG. 1—in which case the degree of power flow control for a given degree of frequency control is enhanced by the frequency selective characteristics of the tuned circuit.

In the particular case of FIG. 1, at the base inversion frequency of 33 kHz, the power flow to the fluorescent lamp load is approximately 30 Watt. At an inversion frequency of 45 kHz, the power flow is only about 4 Watt.

When controlling the inversion frequency by way of controlling the temperature of the ferrite material in the feedback current transformers, as herein described, the response time can not be instantaneous. However, in many applications—especially in the field of lighting—rapid response time is not important.

The saturable transformer herein referred to is equivalent to an ideal transformer shunted with a saturable inductor.

It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. In an inverter circuit having at least one periodically conducting transistor in circuit with a DC voltage input and being operable to provide an AC voltage output, the improvement comprising:

drive current means comprising at least one saturable inductor means for providing transistor drive current to control the conduction period thereof; and heating means for controllably heating the saturable inductor means, thereby to correspondingly decrease the saturation flux density and saturation time thereof, and thereby to correspondingly increase the transistor inversion frequency.

2. The improvement of claim 1 and means to permit adjustable control of the heat supplied to said saturable inductor means.

3. The improvement of claim 1 wherein the heating means is controllably powered and wherein the inverter circuit further comprises a frequency dependent impedance means in circuit with its output, thereby controllably to affect the flow of power from the output as a function of the power provided to the heating means.

4. A self-oscillating inverter comprising:

a pair of switching transistors connected in circuit with a source of DC voltage;

feedback means connected in circuit with said transistors and comprising saturable inductor means, said feedback means being operable to provide drive currents to said transistors, thereby to effect self-oscillating inverter operation, the inversion frequency being dependent on the temperature of said saturable inductor means; and heating means connected in thermal contact with said saturable inductor means and operable to control the temperature thereof, thereby to control the inversion frequency.

5. The inverter of claim 4 having an output and a frequency dependent impedance means in circuit therewith.

6. The inverter of claim 4 and means for controllably providing power to said heating means, thereby controllably affecting the temperature of the saturable inductor means and thereby the inversion frequency.

* * * * *